United States Patent
Bae et al.

(10) Patent No.: US 7,986,251 B2
(45) Date of Patent: Jul. 26, 2011

(54) INPUT/OUTPUT (IO) INTERFACE AND METHOD OF TRANSMITTING IO DATA

(75) Inventors: Seung-jun Bae, Gyeonggi-do (KR); Young-hyun Jun, Seoul (KR); Joo-sun Choi, Gyeonggi-do (KR); Kwang-il Park, Seoul (KR); Sang-hyup Kwak, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 12/547,204

(22) Filed: Aug. 25, 2009

(65) Prior Publication Data

US 2010/0045491 A1 Feb. 25, 2010

(30) Foreign Application Priority Data

Aug. 25, 2008 (KR) .................. 10-2008-0083024

(51) Int. Cl.
*H03M 5/00* (2006.01)
(52) U.S. Cl. .................................... 341/55; 341/61
(58) Field of Classification Search .................. 341/55, 341/58, 61; 340/870.19; 714/794; 307/2, 307/106
See application file for complete search history.

(56) References Cited

U.S. PATENT DOCUMENTS

| 4,642,637 A * | 2/1987 | Baer ................ 340/870.19 |
| 6,331,814 B1 * | 12/2001 | Albano et al. ............ 375/258 |
| 7,450,535 B2 * | 11/2008 | Best ........................ 370/314 |
| 2006/0098731 A1 * | 5/2006 | Bae .......................... 375/240.1 |

FOREIGN PATENT DOCUMENTS

| JP | 2000-115261 | 4/2000 |
| JP | 2005-210695 | 8/2005 |
| KR | 100656448 B1 | 12/2006 |

* cited by examiner

*Primary Examiner* — Brian Young
(74) *Attorney, Agent, or Firm* — Myers Bigel Sibley & Sajovec, P.A.

(57) ABSTRACT

An input/output (IO) interface includes a data encoder which encodes each of a plurality of pieces of parallel data having different timings and generates a plurality of pieces of encoded data, and an alternating current (AC) coupling transmission unit which transmits the plurality of encoded data in an AC coupling method. The data encoder compares first parallel data with second parallel data from among the plurality of pieces of parallel data on a bit-by-bit basis and obtains the number of bits whose logic states have transited between the first parallel data and the second parallel data. When the number of bits whose logic states have transited is greater than or equal to a reference number of bits, the data encoder inverts bit values of the second parallel data to generate the encoded data. When the number of bits whose logic states have transited is less than the reference number of bits, the data encoder maintains the bit values of the second parallel data to generate the encoded data.

18 Claims, 9 Drawing Sheets

<PDATA>

| | PDATA1 | PDATA2 | PDATA3 | PDATA4 |
|---|---|---|---|---|
| DQ1 | 0 | 0 | 1 | 1 |
| DQ2 | 0 | 1 | 0 | 1 |
| DQ3 | 0 | 0 | 1 | 1 |
| DQ4 | 0 | 1 | 0 | 1 |
| DQ5 | 0 | 0 | 0 | 1 |
| DQ6 | 0 | 1 | 0 | 1 |
| DQ7 | 0 | 0 | 1 | 1 |
| DQ8 | 0 | 0 | 0 | 0 |

<EDATA>

| | EDATA1 | EDATA2 | EDATA3 | EDATA4 |
|---|---|---|---|---|
| DQ1 | 0 | 0 | 0 | 0 |
| DQ2 | 0 | 1 | 1 | 0 |
| DQ3 | 0 | 0 | 0 | 0 |
| DQ4 | 0 | 1 | 1 | 0 |
| DQ5 | 0 | 0 | 1 | 0 |
| DQ6 | 0 | 1 | 1 | 0 |
| DQ7 | 0 | 0 | 0 | 0 |
| DQ8 | 0 | 0 | 1 | 1 |
| DBI | 0 | 0 | 1 | 1 |

| | PDATA2 | PDATA3 | EDATA3 |
|---|---|---|---|
| DQ1 | 0 → 1 | | 0 |
| DQ2 | 1 → 0 | | 1 |
| DQ3 | 0 → 1 | | 0 |
| DQ4 | 1 → 0 | | 1 |
| DQ5 | 0 | 0 | 1 |
| DQ6 | 1 → 0 | | 1 |
| DQ7 | 0 → 1 | | 0 |
| DQ8 | 0 | 0 | 1 |
| DBI | TRANSITION:6BITS | | 1 |

| E1DATA | E2DATA | E2DATA_B | SEL DATA |
|--------|--------|----------|----------|
| 1 | 1 | 0 | 1 |
| 1 | 1 | 0 | 0 |
| 0 | 0 | 1 | 0 |
| 1 | 0 | 1 | 1 |
| 0 | 1 | 0 | 1 |
| 1 | 1 | 0 | 0 |
| 0 | 0 | 1 | 1 |
| 0 | 1 | 0 | 0 |
| 0 | 0 | 1 | |

INPUT/OUTPUT (IO) INTERFACE AND METHOD OF TRANSMITTING IO DATA

CROSS-REFERENCE TO RELATED APPLICATIONS

This application claims the benefit of Korean Patent Application No. 10-2008-0083024, filed on Aug. 25, 2008, in the Korean Intellectual Property Office, the disclosure of which is incorporated herein in its entirety by reference.

BACKGROUND

The inventive concept relates to an input/output (IO) interface and a method of transmitting IO data.

Semiconductor memory such as a DRAM includes an IO interface. The IO interface receives data which is to be written to the semiconductor memory, or transmits data read out of the semiconductor memory to the outside of the semiconductor memory.

SUMMARY

According to an aspect of the inventive concept, there is provided an IO interface including a data encoder encoding each of a plurality of pieces of parallel data having different timings and generating a plurality of pieces of encoded data; and an alternating current (AC) coupling transmission unit transmitting the plurality of pieces of encoded data by performing an AC coupling method.

The data encoder compares first parallel data with second parallel data from among the plurality of pieces of parallel data on a bit-by-bit basis and obtains a number of bits whose logic states have transited between the first parallel data and the second parallel data. When the number of bits whose logic states have transited is greater than or equal to a reference number of bits, the data encoder inverts bit values of the second parallel data to generate the encoded data, and when the number of bits whose logic states have transited is less than the reference number of bits, the data encoder maintains the bit values of the second parallel data to generate the encoded data.

The AC coupling transmission unit may transmit the plurality of pieces of encoded data via a channel. The AC coupling transmission unit may be connected to the channel via a capacitor.

The AC coupling transmission unit may include a data transmitter; and a capacitor serially connected to the data transmitter.

According to another aspect of the inventive concept, there is provided an IO interface including a data encoder encoding at least one piece of parallel data and generating at least one piece of first encoded data; a logic state transition controller transforming the at least one piece of first encoded data into second encoded data; and an AC coupling transmission unit transmitting the second encoded data in an AC coupling method.

The data encoder detects logic states of bits of the at least one piece of parallel data. When the number of bits having a first logic state is greater than or equal to a reference number of bits, the data encoder inverts the logic states of the bits of the at least one piece of parallel data to generate the first encoded data, and when the number of bits having the first logic state is less than the reference number of bits, the data encoder maintains the logic states of the bits of the at least one piece of parallel data to generate the second encoded data.

When bits having the first logic state from among the bits included in the at least one piece of first encoded data are detected, the logic state transition controller controls a logic state transition to occur in corresponding bits from among the bits included in the second encoded data.

According to another aspect of the inventive concept, there is provided an IO data transmitting method including encoding each of a plurality of pieces of parallel data having different timings and generating a plurality of pieces of encoded data; and transmitting the plurality of pieces of encoded data by performing an AC coupling method.

In the encoding of the plurality of pieces of parallel data, first parallel data is compared with second parallel data from among the plurality of pieces of parallel data on a bit-by-bit basis, and a number of bits whose logic states have transited between the first parallel data and the second parallel data is obtained. When the number of bits whose logic states have transited is greater than or equal to a reference number of bits, bit values of the second parallel data are inverted to generate the encoded data, and when the number of bits whose logic states have transited is less than the reference number of bits, the bit values of the second parallel data are maintained to generate the encoded data.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The present invention now will be described more fully hereinafter with reference to the accompanying figures, in which embodiments of the invention are shown. This invention may, however, be embodied in many alternate forms and should not be construed as limited to the embodiments set forth herein. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

It will be understood that, when an element is referred to as being "coupled" to another element, it can be directly coupled to the other element or intervening elements may be present. In contrast, when an element is referred to as being "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

An input/output (IO) interface in the specification may be an IO interface of a semiconductor memory such as a DRAM.

Figure 1:
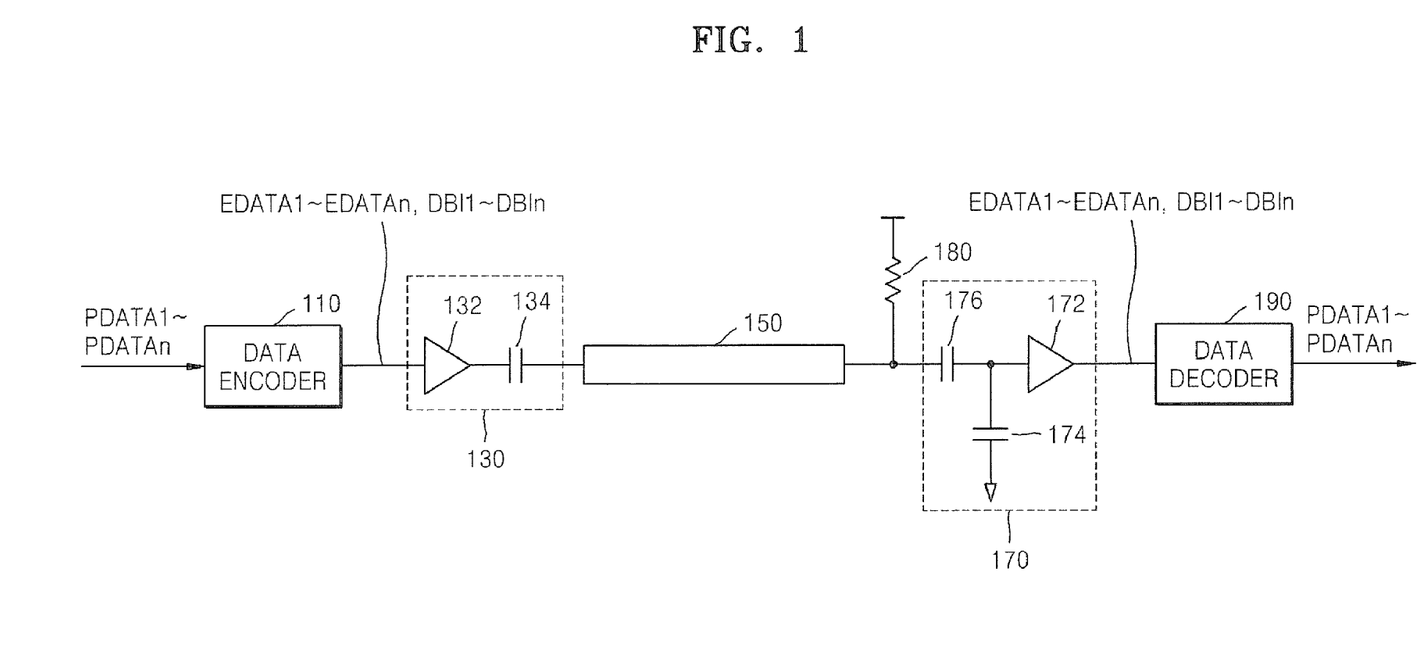
FIG. 1 is a circuit diagram of an input/output (IO) interface according to an embodiment of the inventive concept.

FIG. 1 is a circuit diagram of an IO interface according to an embodiment of the inventive concept. Referring to FIG. 1, the IO interface includes a data encoder 110 and an alternating current (AC) coupling transmission unit 130. The data encoder 110 encodes a plurality of pieces of parallel data PDATA1 through PDATAn having different timings and generates encoded data EDATA1 through EDATAn. The AC coupling transmission unit 130 transmits the encoded data EDATA1 through EDATAn by AC coupling.

Figure 2:
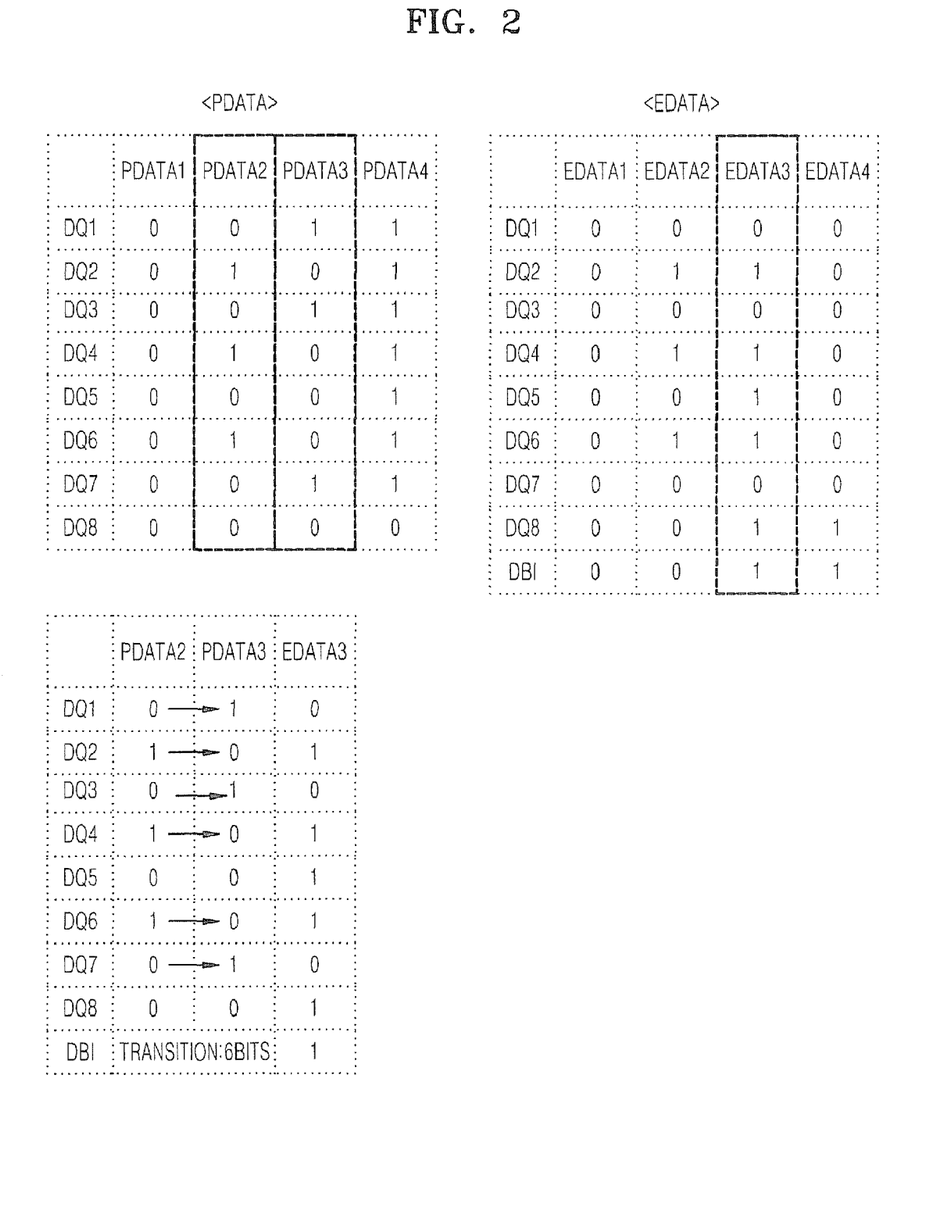
FIG. 2 is a logic state diagram for describing an operation of the IO interface illustrated in FIG. 1.
Figure 3:
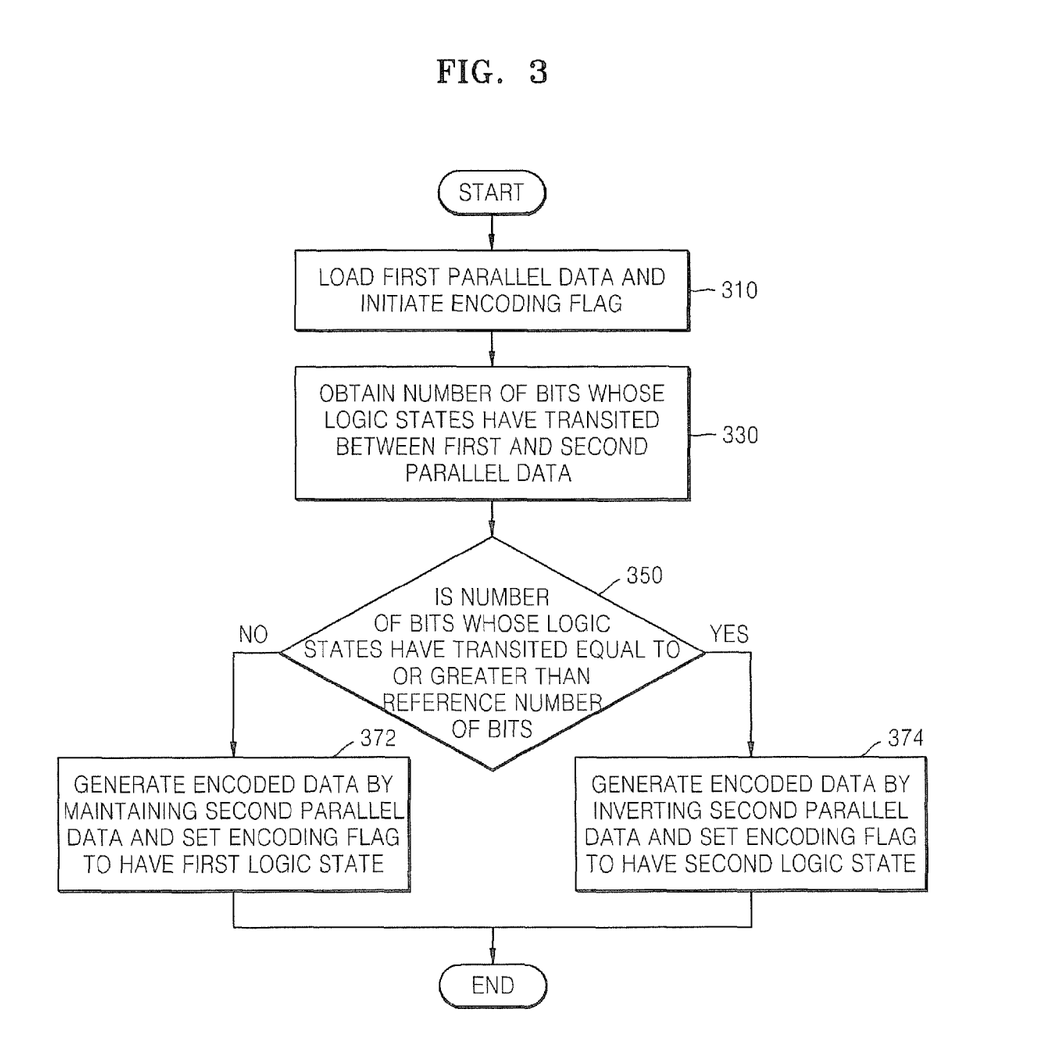
FIG. 3 is a flowchart of the operation of the IO interface illustrated in FIG. 1.

FIG. 2 is a logic state diagram for describing an operation of the IO interface illustrated in FIG. 1. FIG. 3 is a flowchart of the operation of the IO interface illustrated in FIG. 1.

Referring to FIGS. 1 through 3, the data encoder 110 compares two pieces of parallel data from among the parallel data PDATA1 through PDATAn on a bit-by-bit basis. Hereinafter, the two pieces of parallel data are assumed to be parallel data PDATA2 (referred to as first parallel data) and parallel data PDATA3 (referred to as second parallel data). Referring to FIG. 2, the first parallel data PDATA2 is '01010100', and the second parallel data PDATA3 is '10100010'.

Based on a result of the bit-by-bit comparison between the first parallel data PDATA2 and the second parallel data PDATA3, the number of bits whose logic states have transited between the first and second parallel data PDATA2 and PDATA3 is obtained in operation 330 of FIG. 3. In FIG. 2, the number of bits whose logic states have transited is 6 (i.e., bits DQ1, DQ2, DQ3, DQ4, DQ6, and DQ7), and the number of bits whose logic states have not transited is 2 (that is, DQ5 and DQ8).

When the number of bits whose logic states have transited is equal to or greater than a reference number of bits in operation 350 of FIG. 3, all of the bit values of the second parallel data PDATA3 are inverted to generate the encoded data EDATA3 in operation 374 of FIG. 3. On the other hand, when the number of bits whose logic states have transited is less than the reference number of bits in operation 350 of FIG. 3, all of the bit values of the second parallel data PDATA3 are maintained to generate the encoded data EDATA2 in operation 372 of FIG. 3. If the reference number of bits is 4, the number of bits whose logic states have transited, namely, 6, in the embodiment of FIG. 2, is greater than the reference number of bits, namely, 4. Therefore, the encoded data EDATA3 is obtained by inverting the second parallel data PDATA3, and corresponds to '01011011'.

In this manner, the data encoder 110 may obtain the encoded data EDATA1 through EDATA4 for the parallel data PDATA1 through PDTA4 (see FIG. 2).

As such, the IO interface of FIG. 1 may control the number of bits whose logic states have transited between temporally adjacent pieces of parallel data to be less than or equal to the reference number of bits. Accordingly, a switching current, which is generated when a logic state of data transits during data input/output, may be reduced.

The data encoder 110 may also generate encoding flags DBI1 through DBIn. When the data encoder 110 generates the encoded data EDATA3 by maintaining the bit values of the second parallel data PDATA3, the encoding flag DBI2 may be set to have a first logic state. On the other hand, when the data encoder 110 generates the encoded data EDATA3 by inverting the bit values of the second parallel data PDATA3, the encoding flag DBI2 may be set to have a second logic state. Although it is assumed in FIG. 2 that the first logic state is '0' and the second logic state is '1', the first logic state may be '1' and the second logic state may be '0'.

Before the above-described encoding process, the IO interface of FIG. 1 may load the first parallel data PDATA2 and initiate a first encoding flag, namely, the encoding flag DBI1. The loaded first parallel data PDATA2 may be compared with the second parallel data PDATA3. The first encoding flag DBI1 may be initiated to '0'.

Referring to FIG. 1, the AC coupling transmission unit 130 may transmit the encoded data EDATA1 through EDATAn via a channel 150.

The AC coupling transmission unit 130 may include a data transmitter 132 and a capacitor 134. The capacitor 134 may be serially connected to the data transmitter 132. Alternatively, the capacitor 134 may not be included in the AC coupling transmission unit 130 and may be installed separately from the AC coupling transmission unit 130. In this case, the capacitor 134 may be serially connected between the channel 150 and the AC coupling transmission unit 130.

Referring to FIG. 1, the IO interface may further include an AC coupling reception unit 170 and a data decoder 190.

The AC coupling reception unit 170 receives the encoded data EDATA1 through EDATAn from another IO interface via the channel 150. The AC coupling reception unit 170 may include two capacitors 174 and 176 and a data receiver 172. A maximum data transmission speed depends on a ratio of capacitances of the capacitors 174 and 176.

The data decoder 190 decodes the encoded data EDATA1 through EDATAn. The decoding is performed in a reverse manner with respect to the above-described encoding. Thus, a detailed description thereof will be omitted.

The IO interface of FIG. 1 may further include a termination resistor 180. The termination resistor 180 improves signal integrity.

An encoding process performed in the IO interface of FIG. 1 is not limited to the above-described process. For example, when a plurality of encoded data is generated by encoding a plurality of parallel data, the number of bits whose logic states transit between first encoded data and second encoded data from among the encoded data may be minimized. Accordingly, a switching current which is generated when a logic state of data transits during data input/output may be reduced.

Figure 4:
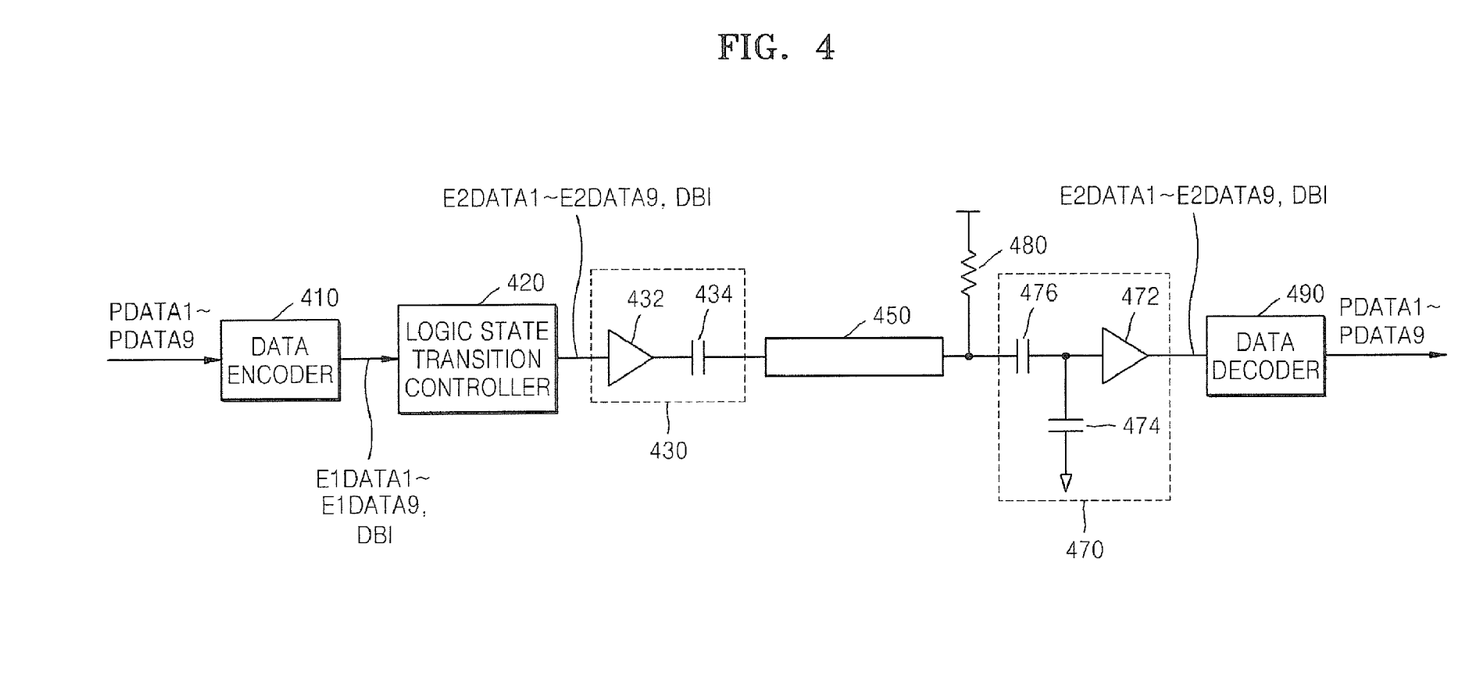
FIG. 4 is a circuit diagram of an IO interface according to another embodiment of the inventive concept.

FIG. 4 is a circuit diagram of an IO interface according to another embodiment of the inventive concept. Referring to FIG. 4, the IO interface includes a data encoder 410, a logic state transition controller 420, and an AC coupling transmission unit 430.

The data encoder 410 encodes at least one piece of parallel data PDATA1 through PDATA9 and generates at least one piece of first encoded data E1DATA1 through E1DATA9. The logic state transition controller 420 transforms the at least one piece of first encoded data E1DATA1 through E1DATA9 into second encoded data E2DATA1 through E2DATA9. The AC coupling transmission unit 430 transmits the second encoded data E2DATA1 through E2DATA9 by performing an AC coupling method. Although 9 pieces of parallel data PDATA1 through PDATA9 are illustrated in FIGS. 4 through 6, this is just an example.

Figure 5:
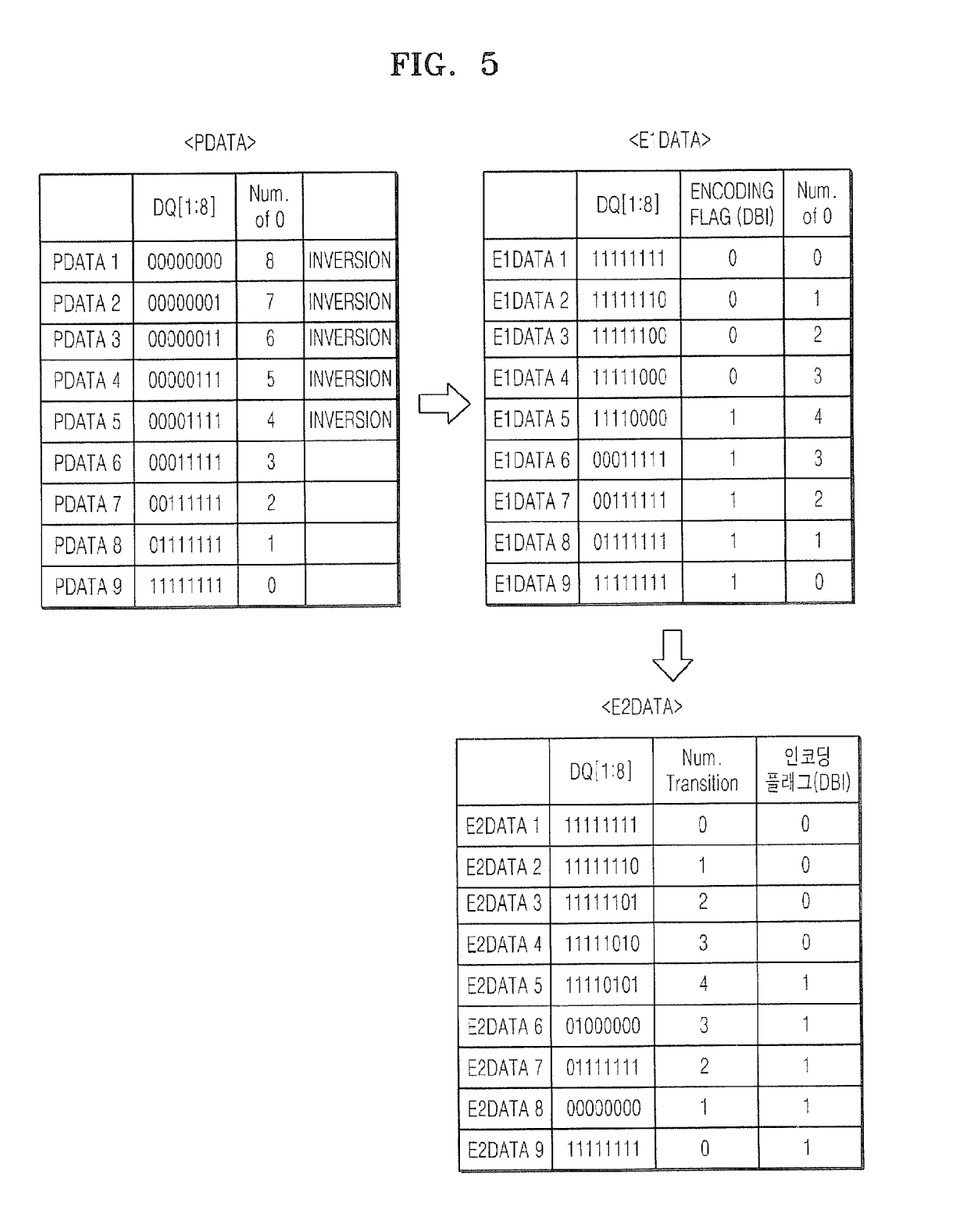
FIG. 5 is a logic state diagram for describing an operation of the IO interface illustrated in FIG. 4.

FIG. 5 is a logic state diagram for describing an operation of the IO interface illustrated in FIG. 4. FIG. 6 is a flowchart of the operation of the IO interface illustrated in FIG. 4.

Figure 6:
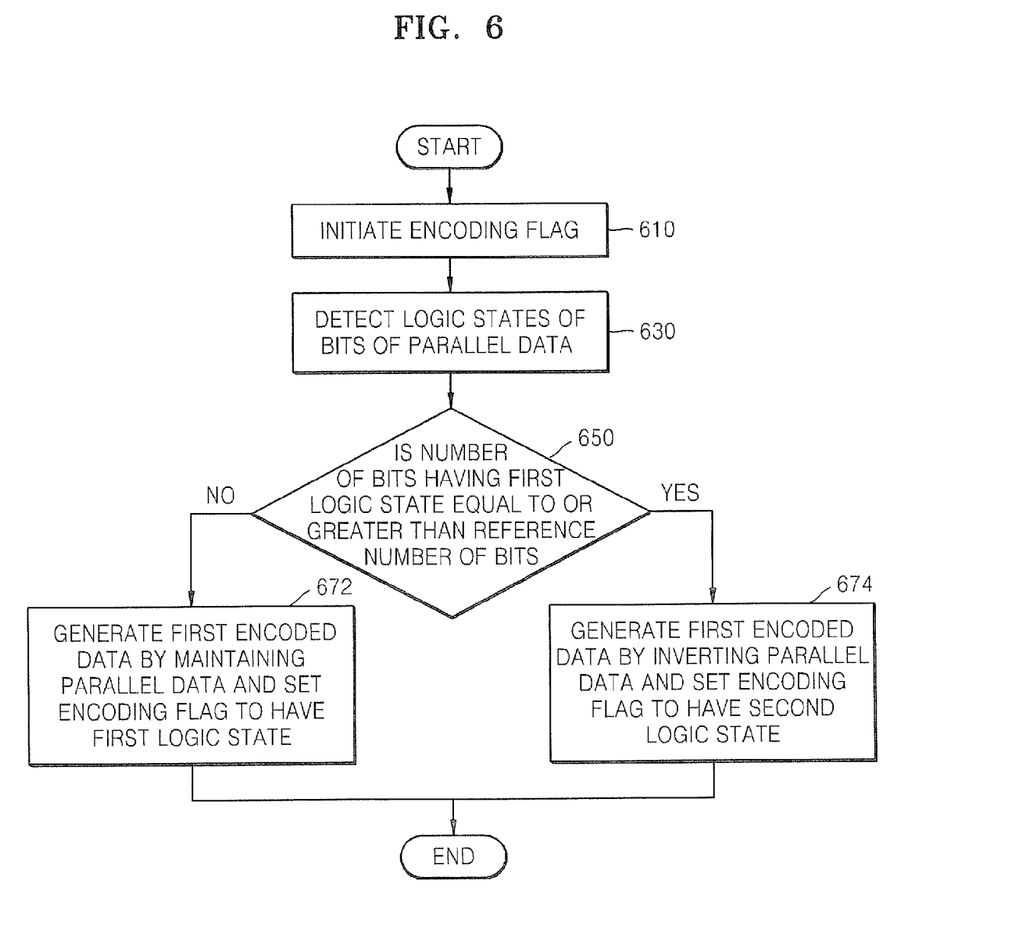
FIG. 6 is a flowchart of an operation of the IO interface illustrated in FIG. 4.

Referring to FIGS. 4 through 6, the data encoder 410 detects logic states of bits that constitute each piece of parallel data PDATA1 through PDATA9, and obtains the number of bits having a first logic state in operation 630 of FIG. 6. In FIG. 5, the first logic state is assumed to be '0'.

If the number of bits having the first logic state in each piece of parallel data is greater than or equal to a reference number of bits in operation 650 of FIG. 6, all of the bits of the parallel data are inverted to generate first encoded data, in operation 674 of FIG. 6. On the other hand, if the number of bits having the first logic state is less than the reference number of bits in operation 650 of FIG. 6, all of the bits of the parallel data are maintained to generate first encoded data, in operation 672 of FIG. 6. Accordingly, in FIG. 5, the data encoder 410 generates the first encoded data E1DATA1 through E1DATA5 by inverting the logic states of the bits of the parallel data PDATA1 through PDATA5, and generates the first encoded data E1DATA6 through E1DATA9 by inverting the logic states of the bits of the parallel data PDATA6 through PDATA9. In FIG. 5, the first logic state is assumed to be '0', and the reference number of bits is assumed to be 4.

When a bit having the first logic state (i.e., '0') is detected from among the bits included in each of the first encoded data E1DATA1 through E1DATA9, the logic state transition controller 420 controls a logic state transition to occur in a corresponding bit of each piece of second encoded data E2DATA1 through E2DATA9. For example, in FIG. 5, the first encoded data E1DATA4 is '11111000'. Since logic states of first through fifth bits of the first encoded data E1DATA4 are 1, logic states of first through fifth bits of the second encoded data E2DATA4 are also determined to be 1. Then, since a logic state of a sixth bit of the first encoded data E1DATA4 is 0, a sixth bit of the second encoded data E2DATA4 is determined to have a logic state of '0' (that is, a logic state to which the logic state of the fifth bit transits). Similarly, since logic states of seventh and eighth bits of the first encoded data E1DATA4 are 0, seventh and eighth bits of the second encoded data E2DATA4 are determined to have logic states of 1 and 0, respectively. Consequently, the second encoded data E2DATA4 is determined to be '11111010'. The number of times (i.e., 3) that the logic state transition occurs in the bits of the second encoded data E2DATA4 is the same as the number of bits (i.e., 3) having the first logic state (i.e., 0) from among the bits that constitute the first encoded data E1DATA4.

In this manner, the data encoder 410 may obtain the first encoded data E1DATA1 through E1DATA9 for the parallel data PDATA1 through PDATA9, and the logic state transition controller 420 may obtain the second encoded data E2DATA1 through E2DATA9 for the first encoded data EDATA1 through EDATA4 (see FIG. 5).

As such, the IO interface of FIG. 4 may control the number of bits whose logic states have transited in each piece of parallel data to be equal to or less than the reference number of bits. Accordingly, a switching current, which is generated when a logic state of data transits during data input/output, may be reduced.

The IO interface of FIG. 1 detects a logic state transition between two pieces of parallel data having different timings, while the IO interface of FIG. 4 detects logic states of the bits of each single piece of the parallel data. Thus, the IO interface of FIG. 4 may have a simple structure compared with the IO interface of FIG. 1.

The data encoder 410 may also generate encoding flags DBI. If the data encoder 410 generates the first encoded data E1DATA1~E1DATA4 by maintaining the bit values of the parallel data PDATA1 through PDATA4, the data encoder 410 may set the encoding flags DBI to have the first logic state. On the other hand, if the data encoder 410 generates the first encoded data E1DATA1~E1DATA4 by inverting the bit values of the parallel data PDATA1 through PDATA4, the data encoder 410 may set the encoding flags DBI to have a second logic state. Although it is assumed in FIG. 5 that the first logic state is '0' and the second logic state is '1', the first logic state may be '1' and the second logic state may be '0'.

The IO interface of FIG. 4 may initiate the encoding flags DBI before performing the above-described encoding process. The encoding flags DBI may be initiated to '0' and '1'.

Referring to FIG. 4, the AC coupling transmission unit 430 may transmit the second encoded data E2DATA1 through E2DATA9 via a channel 450.

The AC coupling transmission unit 430 may include a data transmitter 432 and a capacitor 434. The capacitor 434 may be serially connected to the data transmitter 432. Alternatively, the capacitor 434 may not be included in the AC coupling transmission unit 430 and may be arranged separately from the AC coupling transmission unit 430. In this case, the capacitor 434 may be serially connected between the channel 450 and the AC coupling transmission unit 430.

Referring to FIG. 4, the IO interface may further include an AC coupling reception unit 470 and a data decoder 490.

The AC coupling reception unit 470 receives the second encoded data E2DATA1 through E2DATA9 from another IO interface via the channel 450. The AC coupling reception unit 470 may include two capacitor 474 and 476 and a data receiver 472. A maximum data transmission speed depends on a ratio of capacitances of the capacitors 474 and 476.

The data decoder 490 decodes the second encoded data E2DATA1 through E2DATA9. The decoding is performed in a reverse manner with respect to the above-described encoding. Thus, a detailed description thereof will be omitted.

The IO interface of FIG. 4 may further include a termination resistor 180. The termination resistor 180 improves signal integrity.

An encoding process performed in the IO interface of FIG. 4 is not limited to the above-described process. For example, when a plurality of pieces of first encoded data is generated by encoding a plurality of pieces of parallel data, the parallel data may be encoded so that the number of bits having the first logic state in each first encoded data may be minimized.

Accordingly, a switching current which is generated when a logic state of data transits during data input/output may be reduced.

Figure 7:
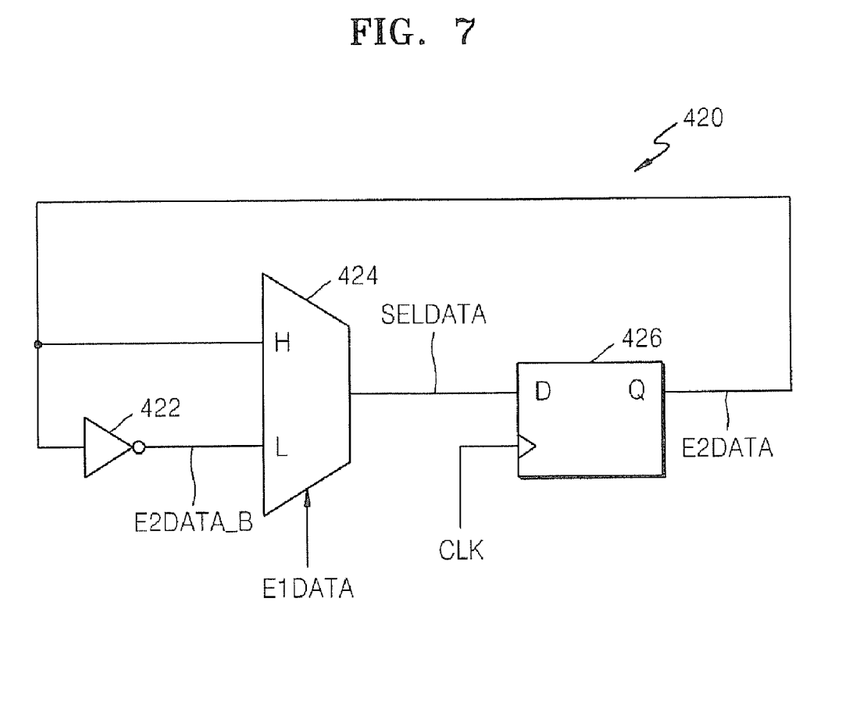
FIG. 7 is a circuit diagram of a logic state transition controller included in the IO interface illustrated in FIG. 4.

FIG. 7 is a circuit diagram of the logic state transition controller 420 included in the IO interface illustrated in FIG. 4. Referring to FIG. 7, the logic state transition controller 420 includes an inverter 422, a multiplexer 424, and a flip-flop 426.

The inverter 422 sequentially receives and inverts the bits of the second encoded data E2DATA. The multiplexer 424 selects and outputs one of a bit inverted by the inverter 422 and a non-inverted bit in response to a logic state of the first encoded data E1DATA. The flip-flop 426 outputs the second encoded data E2DATA in response to an output SELDATA of the multiplexer 424.

Figure 8:
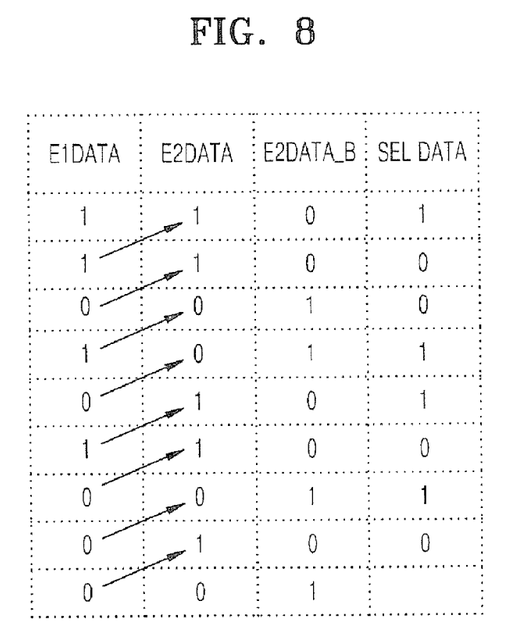
FIG. 8 is a logic state diagram for describing an operation of the logic state transition controller of the IO interface illustrated in FIG. 4.

FIG. 8 is a logic state diagram for describing an operation of the logic state transition controller 420.

Referring to FIG. 8, firstly-arrived second encoded data E2DATA is generated as '1', and firstly-arrived inverted second encoded data E2DATA_B is generated as '0'. Then, when secondly-arrived first encoded data E1DATA is generated as '1', the multiplexer 424 selects the firstly-arrived second encoded data E2DATA generated as '1'. Consequently, the output SELDATA of the multiplexer 424 is '1'. Then, the flip-flop 426 generates '1' in response to a clock signal CLK, and secondly-arrived second encoded data E2DATA is '1'. Similarly, the other data is generated.

Figure 9:
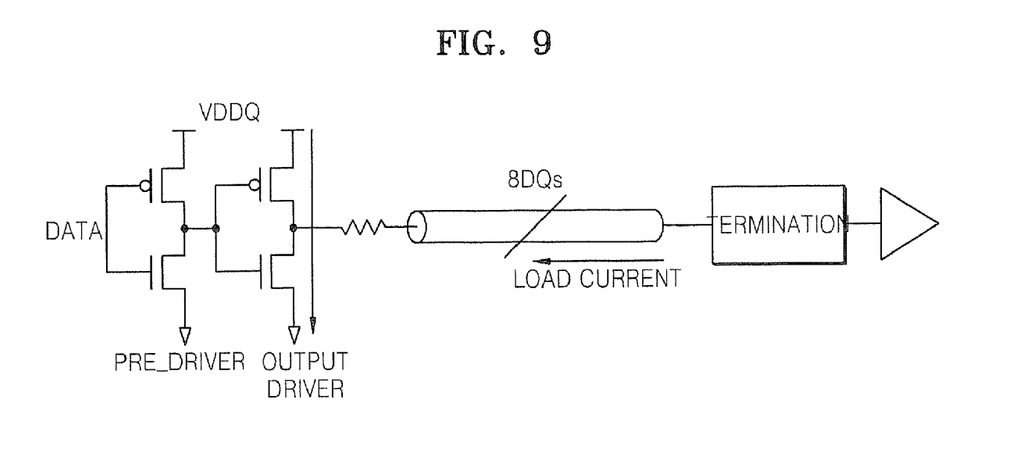
FIG. 9 illustrates an IO interface according to a comparative example to be compared with the IO interfaces according to embodiments of the inventive concept.

FIG. 9 illustrates an IO interface according to a comparative example to be compared with the IO interfaces according to embodiments of the inventive concept.

Referring to FIG. 9, every time the logic state of data is changed, a switching current is generated, and a load current is generated between a termination resistor and an output terminal. Since the IO interface of FIG. 1 does not encode received data and outputs the received data, the switching current may be increased.

Figure 10A:
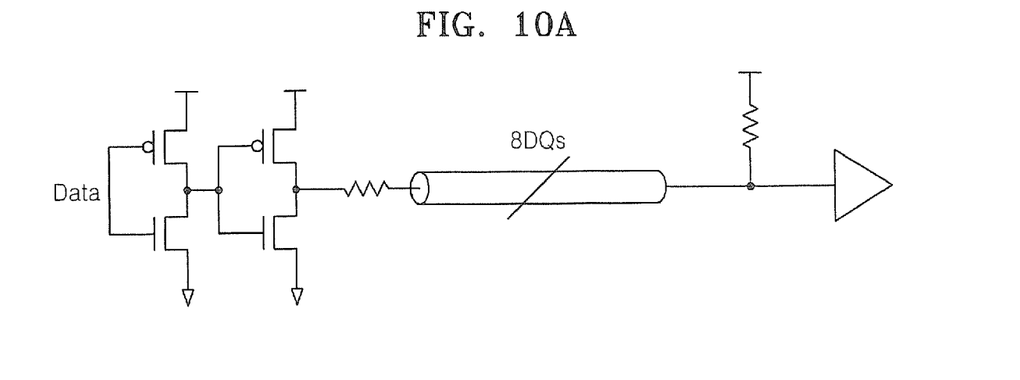
FIGS. 10A, 10B, and 10C illustrates examples of an IO interface according to another comparative example to be compared with the IO interfaces according to embodiments of the inventive concept.
Figure 10B:
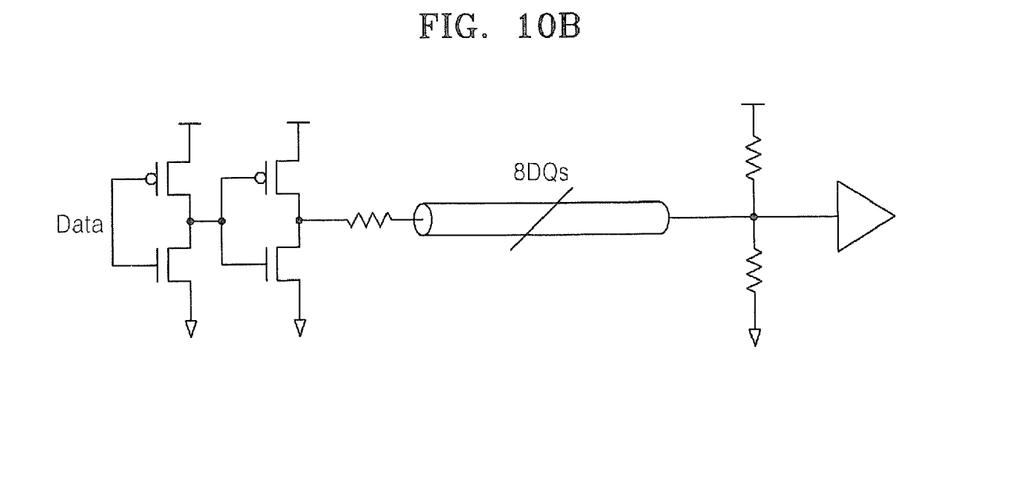
Figure 10C:
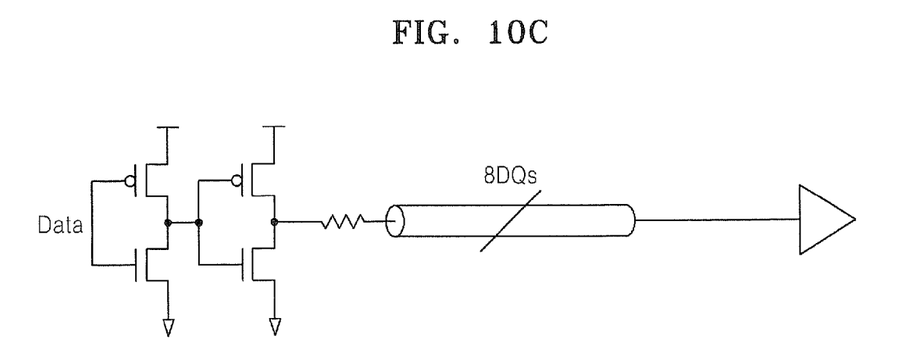

FIGS. 10A, 10B, and 10C illustrate examples of an IO interface according to another comparative example to be compared with the IO interfaces according to embodiments of the inventive concept.

In the IO interface of FIG. 10A, when a bit of data is logic high, a load current is not generated. However, when the bit of the data is logic low, a load current is generated.

In the IO interface of FIG. 10B, when a bit of data is logic high and when the bit of the data is logic low, a load current is generated.

In the IO interface of FIG. 10C, a load current is not generated, but a data transmission speed is low.

Figure 11:
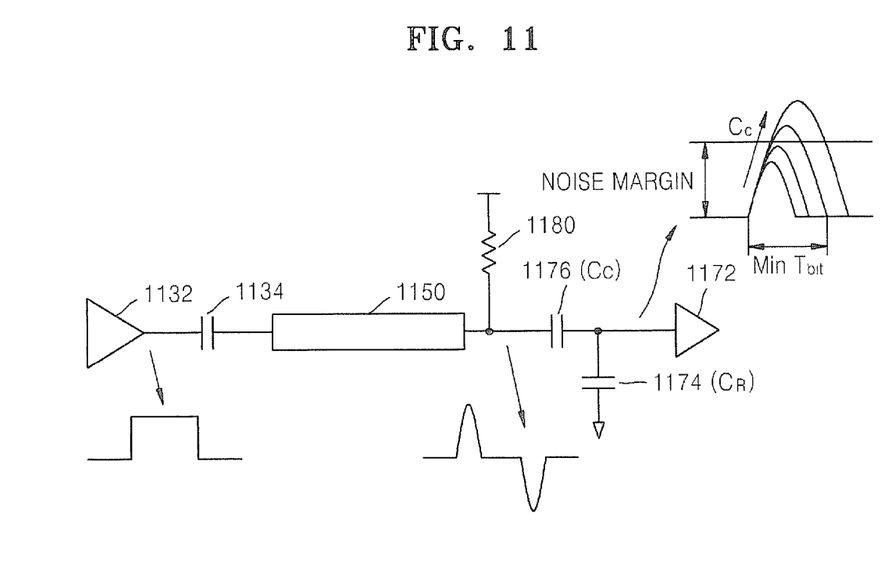
FIG. 11 illustrates an IO interface according to another comparative example to be compared with the IO interfaces according to embodiments of the inventive concept.

FIG. 11 illustrates an IO interface according to another comparative example to be compared with the IO interfaces according to embodiments of the inventive concept.

Since the IO interface of FIG. 11 does not encode received data and output the received data, a switching current may be increased.

An IO data transmitting method according to an embodiment of the inventive concept includes the operations of encoding a plurality of parallel data to generate a plurality of encoded data; and transmitting the encoded data in an AC coupling method.

In the operation of encoding the parallel data, first parallel data and second parallel data among the plurality of the parallel data are compared on a bit-by-bit basis, and the number of bits whose logic states have transited between the first parallel data and the second parallel data is obtained. If the number of bits whose logic states have transited is greater than or equal to a reference number of bits, all of the bit values of the second parallel data are inverted to generate the encoded data. On the other hand, if the number of bits whose logic states have transited is less than the reference number of bits, all of the bit values of the second parallel data are maintained to generate the encoded data.

An IO data transmitting method according to another embodiment of the inventive concept includes the operations of encoding at least one piece of parallel data to generate at least one piece of first encoded data; transforming the at least one piece of first encoded data into second encoded data; and transmitting the second encoded data by performing an AC coupling method.

In the operation of encoding the parallel data, logic states of the bits of the parallel data are detected. If the number of bits having a first logic state is greater than or equal to a reference number of bits, the logic states of the bits of the parallel data are inverted to generate first encoded data. On the other hand, if the number of bits having the first logic state is less than the reference number of bits, the logic states of the bits of the parallel data are maintained to generate the first encoded data.

In the operation of transforming the first encoded data into the second encoded data, when bits having the first logic state from among the bits included in the first encoded data are detected, a logic state transition is controlled to occur in corresponding bits of the second encoded data.

The operations of the IO data transmitting methods according to the above-described embodiments of the inventive concept have already been described above in relation to the IO interfaces of FIGS. 1 and 4, and thus, a detailed description thereof will be omitted here.

While the inventive concept has been particularly shown and described with reference to exemplary embodiments thereof, it will be understood that various changes in form and details may be made therein without departing from the spirit and scope of the following claims.

What is claimed is:

1. An input/output (IO) interface comprising:
a data encoder encoding each of a plurality of pieces of parallel data having different timings and generating a plurality of pieces of encoded data; and
an alternating current (AC) coupling transmission unit transmitting the plurality of pieces of encoded data by performing an AC coupling method,
wherein:
the data encoder compares first parallel data with second parallel data from among the plurality of pieces of parallel data on a bit-by-bit basis and obtains a number of bits whose logic states have transited between the first parallel data and the second parallel data;
when the number of bits whose logic states have transited is greater than or equal to a reference number of bits, the data encoder inverts bit values of the second parallel data to generate the encoded data, and when the number of bits whose logic states have transited is less than the reference number of bits, the data encoder maintains the bit values of the second parallel data to generate the encoded data;
the data encoder generates encoding flags;
when the encoded data is generated by maintaining the bit values of the second parallel data, the data encoder sets the encoding flags to have a first logic state; and
when the encoded data is generated by inverting the bit values of the second parallel data, the data encoder sets the encoding flags to have a second logic state.

2. The IO interface of claim 1, wherein:
the AC coupling transmission unit transmits the plurality of pieces of encoded data via a channel; and the AC coupling transmission unit is connected to the channel via a capacitor.

3. The IO interface of claim 1, wherein the AC coupling transmission unit comprises:
a data transmitter; and
a capacitor serially connected to the data transmitter.

4. The IO interface of claim 1, wherein the IO interface is an IO interface of a semiconductor memory.

5. An IO interface comprising:
a data encoder encoding at least one piece of parallel data and generating at least one piece of first encoded data;
a logic state transition controller transforming the at least one piece of first encoded data into second encoded data; and
an AC coupling transmission unit transmitting the second encoded data in an AC coupling method,
wherein:
the data encoder detects logic states of bits of the at least one piece of parallel data;
when the number of bits having a first logic state is greater than or equal to a reference number of bits, the data encoder inverts the logic states of the bits of the at least one piece of parallel data to generate the first encoded data, and when the number of bits having the first logic state is less than the reference number of bits, the data encoder maintains the logic states of the bits of the at least one piece of parallel data to generate the second encoded data; and
when bits having the first logic state from among the bits included in the at least one piece of first encoded data are detected, the logic state transition controller controls a logic state transition to occur in corresponding bits from among the bits included in the second encoded data;
the data encoder generates encoding flags;
when the at least one piece of first encoded data is generated by maintaining the logic states of the bits of the at least one piece of parallel data, the data encoder sets the encoding flags to have the first logic state; and
when the at least one piece of first encoded data is generated by inverting the logic states of the bits of the at least one piece of parallel data, the data encoder sets the encoding flags to have a second logic state.

6. The IO interface of claim 5, wherein the first logic state is logic low.

7. The IO interface of claim 5, wherein the logic state transition controller comprises:
an inverter sequentially receiving and inverting the bits included in the second encoded data;
a multiplexer selecting and outputting one of a bit inverted by the inverter and a non-inverted bit in response to a logic state of the at least one piece of first encoded data; and
a flip-flop outputting the second encoded data in response to an output of the multiplexer.

8. The IO interface of claim 5, wherein:
the AC coupling transmission unit transmits the second encoded data via a channel; and
the AC coupling transmission unit is connected to the channel via a capacitor.

9. The IO interface of claim 5, wherein the AC coupling transmission unit comprises:
a data transmitter; and
a capacitor serially connected to the data transmitter.

10. An IO data transmitting method comprising:
encoding each of a plurality of pieces of parallel data having different timings and generating a plurality of pieces of encoded data; and
transmitting the plurality of pieces of encoded data by performing an AC coupling method,
wherein:
in the encoding of the plurality of pieces of parallel data, first parallel data is compared with second parallel data from among the plurality of pieces of parallel data on a bit-by-bit basis, and a number of bits whose logic states have transited between the first parallel data and the second parallel data is obtained;
when the number of bits whose logic states have transited is greater than or equal to a reference number of bits, bit values of the second parallel data are inverted to generate the encoded data, and when the number of bits whose logic states have transited is less than the reference number of bits, the bit values of the second parallel data are maintained to generate the encoded data;
generating encoding flags;
when the encoded data is generated by maintaining the bit values of the second parallel data, setting the encoding flags to have a first logic state; and
when the encoded data is generated by inverting the bit values of the second parallel data, setting the encoding flags to have a second logic state.

11. The IO data transmitting method of claim 10, further comprising:
receiving the encoded data transmitted in the transmitting of the encoded data in the AC coupling method; and
decoding the received encoded data.

12. An IO data transmitting method comprising:
encoding at least one piece of parallel data and generating at least one piece of first encoded data;
transforming the at least one piece of first encoded data into second encoded data; and
transmitting the second encoded data by performing an AC coupling method,
wherein:
in the encoding of the at least one piece of parallel data, logic states of bits of the at least one piece of parallel data are detected;
when the number of bits having a first logic state is greater than or equal to a reference number of bits, the logic states of the bits of the at least one piece of parallel data are inverted to generate the first encoded data, and when the number of bits having the first logic state is less than the reference number of bits, the logic states of the bits of the at least one piece of parallel data are maintained to generate the second encoded data;
in the transforming of the first encoded data into the second encoded data, when bits having the first logic state from among the bits included in the first encoded data are detected, a logic state transition is controlled to occur in corresponding bits from among the bits included in the second encoded data;
generating encoding flags;
when the at least one piece of first encoded data is generated by maintaining the logic states of the bits of the at least one piece of parallel data, setting the encoding flags to have the first logic state; and
when the at least one piece of first encoded data is generated by inverting the logic states of the bits of the at least one piece of parallel data, setting the encoding flags to have a second logic state.

13. The IO data transmitting method of claim 12, further comprising:
receiving the second encoded data transmitted in the transmitting of the second encoded data by performing the AC coupling method; and
decoding the received second encoded data.

14. An IO interface comprising:
a data encoder encoding each of a plurality of pieces of parallel data having different timings and generating a plurality of pieces of encoded data having different timings; and
an AC coupling transmission unit transmitting the plurality of pieces of encoded data by performing an AC coupling method,
wherein:
the data encoder encodes the plurality of pieces of parallel data so that the number of bits whose logic states transit between first encoded data and second encoded data is minimized;
the data encoder compares first parallel data with second parallel data from among the plurality of pieces of parallel data on a bit-by-bit basis and obtains a number of bits whose logic states have transited between the first parallel data and the second parallel data;
when the number of bits whose logic states have transited is greater than or equal to a reference number of bits, the data encoder inverts bit values of the second parallel data to generate the encoded data, and when the number of bits whose logic states have transited is less than the reference number of bits, the data encoder maintains the bit values of the second parallel data to generate the encoded data;
the data encoder generates encoding flags;
when the encoded data is generated by maintaining the bit values of the second parallel data, the data encoder sets the encoding flags to have a first logic state; and
when the encoded data is generated by inverting the bit values of the second parallel data, the data encoder sets the encoding flags to have a second logic state.

15. The IO interface of claim 14, further comprising:
an AC coupling reception unit receiving the plurality of pieces of encoded data from another IO interface; and
a data decoder decoding the plurality of pieces of received encoded data.

16. The IO interface of claim 14, wherein:
the AC coupling transmission unit transmits the plurality of encoded data via a channel; and
the AC coupling transmission unit is connected to the channel via a capacitor.

17. An IO interface comprising:
a data encoder encoding at least one piece of parallel data and generating at least one piece of first encoded data;
a logic state transition controller transforming the first encoded data into second encoded data; and
an AC coupling transmission unit transmitting the second encoded data by performing an AC coupling method,
wherein:
the data encoder detects logic states of bits of the parallel data and encodes the at least one piece of parallel data so that the number of bits having a first logic state is minimized, thereby generating the first encoded data;
when bits having the first logic state from among the bits included in the first encoded data are detected, the logic state transition controller controls logic state transition to occur in corresponding bits from among the bits included in the second encoded data;
when the number of bits having a first logic state is greater than or equal to a reference number of bits, the data encoder inverts the logic states of the bits of the parallel data to generate the first encoded data;
when the number of bits having the first logic state is less than the reference number of bits, the data encoder maintains the logic states of the bits of the parallel data to generate the second encoded data;
the data encoder generates encoding flags;
when the at least one piece of first encoded data is generated by maintaining the logic states of the bits of the at least one piece of parallel data, the data encoder sets the encoding flags to have the first logic state; and
when the at least one piece of first encoded data is generated by inverting the logic states of the bits of the at least one piece of parallel data, the data encoder sets the encoding flags to have a second logic state.

18. The IO interface of claim 17, further comprising:
an AC coupling reception unit receiving the second encoded data from another IO interface; and
a data decoder decoding the received second encoded data.

* * * * *